United States Patent
Dueber et al.

(10) Patent No.: US 7,348,373 B2
(45) Date of Patent: *Mar. 25, 2008

(54) POLYIMIDE COMPOSITIONS HAVING RESISTANCE TO WATER SORPTION, AND METHODS RELATING THERETO

(75) Inventors: Thomas E. Dueber, Wilmington, DE (US); John D. Summers, Chapel Hill, NC (US); Xin Fang, Newark, DE (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 324 days.

This patent is subject to a terminal disclaimer.

(21) Appl. No.: 10/782,326

(22) Filed: Feb. 19, 2004

(65) Prior Publication Data

US 2005/0154181 A1    Jul. 14, 2005

Related U.S. Application Data

(60) Provisional application No. 60/535,453, filed on Jan. 9, 2004.

(51) Int. Cl.
*C08G 73/10* (2006.01)

(52) U.S. Cl. ............ 524/107; 523/212; 524/111; 524/113; 524/356; 524/359; 524/361; 524/362; 524/363; 524/364; 524/366; 524/375; 524/379; 524/384; 524/430; 524/538

(58) Field of Classification Search ........ 528/170, 528/322, 353; 524/107, 111, 113, 356, 359, 524/361, 362, 363, 364, 366, 375, 379, 384, 524/430, 538; 523/212
See application file for complete search history.

(56) References Cited

U.S. PATENT DOCUMENTS

| 5,059,941 | A | | 10/1991 | Gofuku et al. |
|---|---|---|---|---|
| 5,071,997 | A | | 12/1991 | Harris |
| 5,202,412 | A | * | 4/1993 | Auman et al. ............ 528/353 |
| 5,275,750 | A | | 1/1994 | Sato et al. |
| 5,302,412 | A | * | 4/1994 | Tamhankar et al. ........ 427/102 |
| 5,426,071 | A | | 6/1995 | Summers |
| 5,493,003 | A | | 2/1996 | Blum et al. |
| 5,714,572 | A | * | 2/1998 | Kato .................... 528/310 |
| 6,030,553 | A | | 2/2000 | Huang et al. |
| 6,084,053 | A | * | 7/2000 | Matsubara et al. ........ 528/170 |
| 7,018,776 | B2 | * | 3/2006 | Rushkin et al. .......... 430/271.1 |

FOREIGN PATENT DOCUMENTS

| EP | 0 337 412 A2 | 10/1989 |
|---|---|---|
| EP | 0 588 136 A2 | 3/1994 |
| EP | 0 918 339 A2 | 5/1999 |
| JP | 4061703 | 2/1992 |
| JP | 1995226302 A | 9/1995 |
| JP | 2000-164403 A | 6/2000 |
| WO | WO 90/03420 | 4/1990 |
| WO | WO 94/02540 | 2/1994 |

* cited by examiner

*Primary Examiner*—Ana Woodward

(57) ABSTRACT

Water absorption resistant polyimide pastes (or solutions), are particularly useful to make electronic screen printable pastes and the electronic components made from these pastes. A group of soluble polyimides and their solvents were discovered to be particularly resistant to moisture absorption. These polyimide solutions optionally contain polyimides also containing cross-linkable monomers and/or thermal cross-linking agents. In addition, these polyimide pastes may optionally contain adhesion promoting agents, blocked isocyanates, metals, metal oxides, and other inorganic fillers. The polyimide pastes (or solutions) of the present invention have a polyimide with a glass transition temperature greater than 250° C., have a water absorption factor of less than 2%, and a have a positive solubility measurement.

13 Claims, No Drawings

POLYIMIDE COMPOSITIONS HAVING RESISTANCE TO WATER SORPTION, AND METHODS RELATING THERETO

FIELD OF INVENTION

The present invention relates generally to polyimides useful as substrates for electronic circuits and similar-type applications. More specifically, the polyimide based liquids, solutions, suspensions and/or pastes (hereafter, simply referred to as "pastes") of the present invention can generally be screen printed or otherwise formed into an electronic substrate, pattern or device with relatively low (unwanted) water sorption, among other advantages further described below. As used herein, "sorption" is intended to mean adsorption and/or absorption.

BACKGROUND OF THE INVENTION

Resistors, capacitors, inductors, electrical (or thermal) conductors, and similar-type electronic components or devices can be made from solutions, suspensions or paste materials (hereafter, simply referred to as "pastes") often by means of screen-printing (including stencil printing) techniques, followed by solidification by heat and/or chemical reaction (see generally, U.S. Pat. No. 5,980,785 to Xi, et al.). Increasingly, such pastes are required to be: i. highly soluble in useful solvents that absorb little to no water; and ii. process (e.g., cure) at relatively low temperatures, such as, below 200, 190, 185, 180, 175, 170, 165, 160, 155 or 150° C. In some instances, there is a need for such pastes to provide acceptable adhesion to copper without prior (copper) passivation, e.g., copper passivation by silver immersion.

SUMMARY OF THE INVENTION

The present invention is directed to a polymer solution comprising a polyimide component and an organic solvent. The polyimide component is represented by formula I

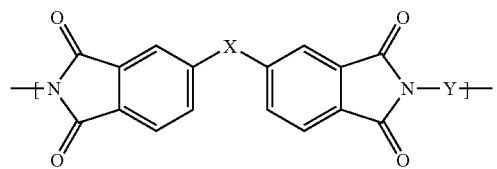

where X is O, S(O)$_2$ or C(CF$_3$)$_2$, or a mixture of two or three of O, S(O)$_2$, and C(CF$_3$)$_2$;

where Y is a diamine component selected from a group consisting of m-phenylenediamine (MPD), 3,4'-diaminodiphenyl ether (3,4'-ODA), 4,4'-diamino-2,2'-bis(trifluoromethyl)biphenyl (TFMB), 3,3'-diaminodiphenyl sulfone (3,3'-DDS), bis-(4-(4-aminophenoxy)phenyl)sulfone (BAPS) and 9,9-bis(4-aminophenyl)fluorene (FDA);

provided however that:

a. if X is O, then Y is not m-phenylenediamine (MPD), bis-(4-(4-aminophenoxy)phenyl)sulfone (BAPS) or 3,4'-diaminodiphenyl ether (3,4'-ODA);

b. if X is S(O)$_2$, then Y is not 3,3'-diaminodiphenyl sulfone (3,3'-DDS); and c. if X is C(CF$_3$)$_2$, then Y is not m-phenylenediamine (MPD), bis-(4-(4-aminophenoxy)phenyl)sulfone (BAPS), 9,9-bis(4-aminophenyl)fluorene (FDA), or 3,3'-diaminodiphenyl sulfone (3,3'-DDS).

The organic solvent of the present invention is a liquid having: (i.) a Hanson polar solubility parameter between and including any two of the following numbers 2.5, 3.0, 4.0, 5.0, 6.0, 7.0, 8.0, 9.0, and 10.0; and (ii.) a normal boiling point between and including any two of the following temperatures 180, 190, 200, 210, 220, 230, 240 and 250° C.

The polyimide and solvent are combined into a paste—"paste" is intended to include solutions, suspensions or otherwise a homogeneous or non-homogeneous blending of the two materials. In one embodiment, the polyimide paste can be combined with a thermal cross-linking agent, or the polyimide component can further comprise a crosslink site (by incorporation of a crosslink monomer) in the polyimide backbone. In some embodiments of the present invention, it may be useful for the polyimide paste to further comprise a blocked isocyanate, an adhesion promoter, and/or inorganic fillers, including metals or metal oxides.

The present invention is also directed to polyimide paste compositions comprising a polyimide with a glass transition temperature greater than 225, 230, 235, 240, 245 or 250° C. and a suitable organic solvent wherein the polyimide liquid or paste exhibits a positive solubility measurement. These pastes may also optionally contain inorganic fillers, such as metals and metal oxides. In some embodiments, metal oxide filler is particularly preferred.

The compositions of the present invention can generally be used in electronic circuitry type applications. In particular, the compositions can generally be used to produce electronic components such as resistors, discrete or planar capacitors, inductors, encapsulants, conductive adhesives and electrical and thermal conductors.

DETAILED DESCRIPTION OF THE PREFERRED EMBODIMENTS

In one embodiment, the present invention is directed toward low water absorption, stable polyimide pastes that are used to prepare resistor materials. The resistor paste compositions of the present invention can be applied to a variety of substrate materials to make embedded passive-type resistors or other related planar (either embedded or non-embedded) electronic components. One type of electronic component is a polymer thick film (PTF) resistor. These resistors are typically formed using screen printable liquids or pastes.

In one embodiment of the present invention, a PTF resistor composition is made from a screen-printable resistor paste composition of the present invention. The resistor paste composition is derived from a polyimide paste and an electrically conductive material (e.g. metal oxides in the form of a fine powder).

The PTF resistor paste can be applied on a suitable substrate using screen-printing (including stencil printing) or any other similar-type technique. Following a drying process, the printed pastes can be cured at relatively low temperatures to remove unwanted solvent. The paste will tend to shrink and compress the conductive particles together, resulting in electrical conductivity between the particles. The electrical resistance of the system tends to depend on the resistance of the materials incorporated into the polymer binder, their particle sizes and loading, as well as the nature of the polymer binder itself.

The electrical resistance of a PTF resistors formed in this fashion is very much dependent on the distances between the electrically conductive particles. The PTF resistors of the present invention require physical stability of the polymer binder when exposed to high temperatures and high moisture environments. This is important, so that there is no appreciable or undue change in the electrical resistance of the resistor.

PTF resistor stability can be measured by several known test measurements, including exposing the resistor to environments at 85° C. and 85% relative humidity to show accelerated aging, thermal cycling performance, as well as resistance to the exposure of soldering materials. The high performance PTF resistors of the present invention will typically exhibit little, if any, meaningful change in resistance following these tests. PTF materials may also encounter multiple exposures to solder with wave and re-flow solder operations. These thermal excursions are also a source of instability for traditional PTF resistors, particularly when printed directly on copper.

Polyimides are generally prepared from a dianhydride, or the corresponding diacid-diester, diacid halide ester, or tetra-carboxylic acid derivative of the dianhydride, and a diamine. For purposes of the present invention, a particular group of dianhydrides was discovered to be particularly useful in the preparation of water resistant polyimide pastes. These dianhydrides are 4,4'-oxydiphthalic anhydride (ODPA), bis(3,4-dicarboxyphenyl)sulfoxide dianhydride (DSDA), and 2,2-bis-(3,4-dicarboxyphenyl) 1,1,1,3,3,3,-hexafluoropropane dianhydride (6-FDA).

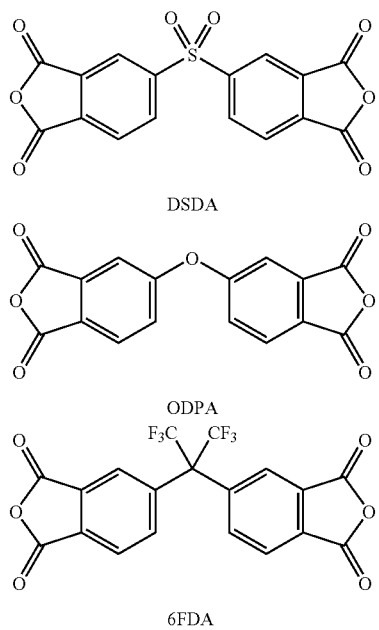

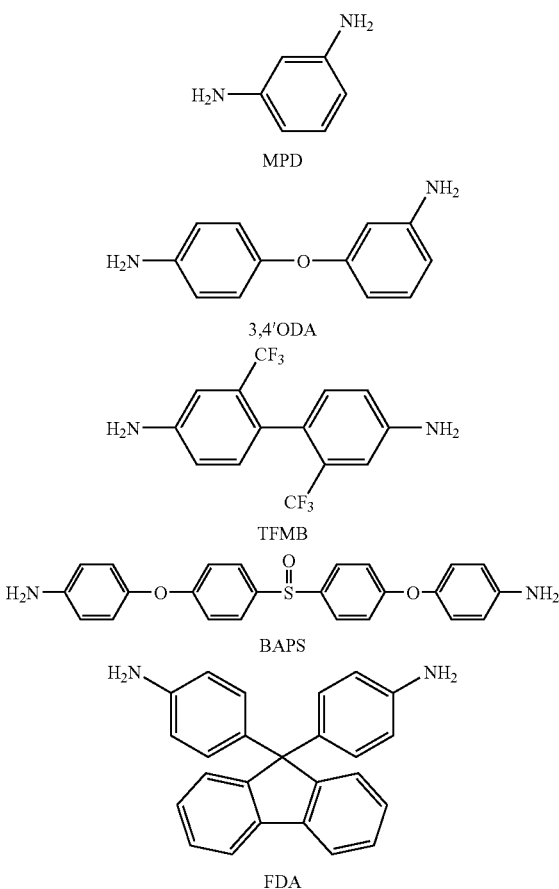

For purposes of the present invention, a particular group of diamines was discovered to be particularly useful in the preparation of water resistant polyimide solutions and pastes. These diamines are m-phenylenediamine (MPD), 3,4'-diaminodiphenyl ether (3,4'-ODA), 4,4'-diamino-2,2'-bis(trifluoromethyl)biphenyl (TFMB), 3,3'-diaminodiphenyl sulfone (3,3'-DDS), bis-(4-(4-aminophenoxy)phenyl)sulfone (BAPS) and 9,9-bis(4-aminophenyl)fluorene (FDA).

Surprisingly, each of the dianhydrides found to be useful when combined with each diamine also found to be useful, does not necessarily form a useful polyimide for the purposes of this invention. In fact, some combinations of these dianhydrides and diamines will not form a useful polyimide solution paste.

For example, if ODPA is selected as the dianhydride and either MPD, BAPS or 3,4'-ODA is chosen as the diamine, a less useful polyimide is formed. In addition, if DSDA is selected as the dianhydride, then 3,3'-DDS is not as useful a diamine in most applications. Finally, if 6-FDA is selected as the dianhydride then MPD, BAPS, FDA, and 3,3'-DDS is not as useful a diamine. However, all other combinations of the diamines and dianhydrides disclosed herein will form useful polyimides for the purposes of this invention.

In addition, certain solvents must also be used in conjunction with the useful polyimides discussed herein. These solvents allow the polyimide pastes formed to possess sufficient resistance to moisture absorption, particularly during a screen-printing process.

Solvents known to be useful in accordance with the present invention include organic liquids having both: (i.) a Hanson polar solubility parameter between and including any two of the following numbers 2.5, 3.0, 4.0, 5.0, 6.0, 7.0, 8.0, 9.0, and 10.0, provided the polyimide is sufficiently soluble in the solvent to form an acceptable paste, depending upon the particular end use application chosen; and (ii.) a normal boiling point between and including any two of the following numbers 180, 190, 200, 210, 220, 230, 240 and 250° C.

In one embodiment of the present invention, preferred solvents are represented by any one, or any combination of, formulas II, III and/or IV,

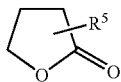

where $R^5$ is H, $CH_3$, or $CH_3CH_2$

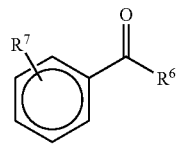

where $R^6$ is H, $CH_3$, $CH_3CH_2$, or $OCH_3$ and wherein $R^7$ is H, $CH_3$, or $CH_3CH_2$ and

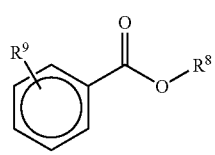

where $R^8$ is $CH_3$, or $CH_3CH_2$ and wherein $R^9$ is H, $CH_3$, or $CH_3CH_2$.

Because screen-printing is often the method of choice for PTF resistors, the paste must generally remain stable for reasonably long exposures to ambient moisture while the paste resides on the screen. If the polyimide solution is not stable to moisture absorption, the polyimide can precipitate, making the paste unusable and thereby requiring considerable effort to remove the residual damaged paste from the screen. Additionally, excessive water uptake can also cause the paste's viscosity to drift, thus altering the printed resistor thickness and ultimately the cured resistance.

In one embodiment of the present invention, the polyimides have cross-linkable sites. The crosslinkable sites can be provided by preparing the polyimide in the presence of a second diamine, preferably, a second diamine with an organic radical Z containing one or more phenol groups. One preferred cross-linkable diamine is 3,3'-dihydroxy-4,4'-diaminobiphenyl (HAB). This diamines has the following structure,

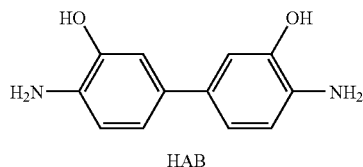

HAB

Other diamines that are cross-linkable are selected from the following group 2,4-diaminophenol, 2,3-diaminophenol, 3,3'-diamino-4,4'-dihydroxy-biphenyl, and 2,2'-bis(3-amino-4-hydroxyphenyl)hexafluoropropane. For purposes of the present invention, a cross-linkable diamine may be used as a part of the total diamine component ranging from 0, 2, 4, 6, 10, 15, 20, 25, and up to and including 30 mole percent.

Both the preferred non-crosslinkable polyimides and the crosslinkable polyimides of the invention exhibit relatively high solution stability in select solvents, most notably if the polyimide solutions are exposed to high moisture environments. The solution stability translates to relatively high stable liquid or paste compositions that contain the polyimides. The liquid or paste compositions can then be used in a variety of electronic applications as described in this Application.

The resulting polyimides of the invention including the non-crosslinkable and crosslinkable polyimides will have a glass transition temperature (Tg) greater than 250° C., preferably greater than 290° C., more preferably greater than 310° C. The Tg for the crosslinkable polyimides of the invention can generally be lower than the non-crosslinkable polyimides of the invention because upon curing the crosslinking can further stabilize the resulting material. One potential disadvantage of the crosslinkable polyimides is that the crosslinking agents added to the composition can also absorb moisture from the solvent and environment, which can further destabilize the compositions.

In one embodiment, the polyimides of the invention, including the non-crosslinkable polyimides and crosslinkable polyimides, will have a water absorption factor of 2% or less, preferably 1.5% or less, and more preferably 1% or less. The amount of water absorption is determined by ASTM D-570, which is a method known to those skilled in the art, and is further described in the Example section.

The non-crosslinkable polyimides and crosslinkable polyimides of the invention also exhibit a positive moisture solubility measurement.

As described herein a "positive moisture solubility" defines a polyimide solution containing 10% solids that is stable in an environment with a relative humidity of about 75% for a period greater than or equal to eight (8) hours.

The moisture solubility measurement is a test Applicants used to measure the polyimide solution stability in a high moisture environment. The stability of the polyimide solutions in high moisture environments is important because processing of the liquid or paste compositions, which involves ingredient mixing, 3 roll milling and screen printing, can take from 2 hours and up to 8 hours. During this time, it is important that the polyimide does not precipitate in the liquid or paste compositions.

Also most if not all, polyimides are soluble in only select polar organic solvents. The polar organic solvents act like a sponge and absorb water from the ambient environment. Often, the relative humidity is sufficiently high that water absorption into the composition is significant. The water in the composition and in the polyimide solutions can cause the polyimide to precipitate, which essentially renders the composition useless. The composition must be discarded, and the screen may be damaged in attempts to remove intractable paste plugging the holes in the screen.

However, certain dianhydrides, used in conjunction with certain diamines, provide more stable polyimide solutions than others, but these polyimides must also be used in certain organic liquids.

It is to be understood however, that the choice of which dianhydride to use to prepare the polyimide will depend upon the choice of diamines and upon commercial application of the polyimide solution. No doubt, some commercial applications require certain composition properties, while others do not, or the property is not as critical for that particular application. Therefore, not in all cases will 6-FDA be preferred over the other listed dianhydrides. In fact, ODPA may be preferred over 6-FDA in some applications. It is also to be understood however, that the choice of which diamine to use to prepare the polyimide will depend upon the choice of dianhydrides and upon the commercial application of the polyimide solution. No doubt, some commercial applications require certain composition properties, while others do not, or the property is not as critical for that particular application. Therefore, not in all cases will TFMB be preferred over the other listed diamines. In fact, 3,4'-ODA may be preferred over TFMB in some applications.

The polyimides of the invention are prepared by reacting one or more of the dianhydrides (or the corresponding diacid-diester, diacid halide ester, or tetracarboxylic acid thereof) with one or more diamines. The mole ratio of dianhydride to diamine is preferably from 0.9 to 1.1. Preferably, a slight molar excess of dianhydrides is used to give a mole ratio of about 1.01 to 1.02. A preferred non-crosslinkable polyimide of the invention is prepared from DSDA and TFMB or from ODPA and TFMB.

Preferred crosslinkable polyimide of the invention are prepared using DSDA diamine, TFMB and HAB in combination, ODPA, 6-FDA dianhydride, 3,4'-ODA and HAB in combination. The polyimides prepared from the stated dianhydrides and diamines exhibited a solution stability of greater than or equal to 8 hours in an environment with a RH of about 80% (See Table 2).

The polyimides of the present invention can be made by thermal and chemical imidization using a different solvent as otherwise described herein. The polyimide can be dried of the solvent then re-dissolved in a solvent disclosed herein. Using a thermal method, the dianhydride can be added to a solution of the diamine in any of the following polar solvents, m-cresol, 2-pyrrolidone, N-methylpyrrolidone (NMP), N-ethylpyrrolidone, N-vinylpyrrolidone, N,N-dimethylacetamide (DMAc), N,N-dimethylformamide (DMF) and γ-butyrolactone (BLO). The reaction temperature for preparation of the polyamic acid or polyamic acid ester is typically between 25° C. and 40° C. Alternatively, the dianhydrides were dissolved in one of these solvents, and the diamines were added to the dianhydride solution.

After the polyamic acid (or polyamic acid ester) is produced, the temperature of the reaction solution is then raised considerably to complete the dehydration ring closure. The temperatures used to complete the ring closure are typically from 150° C. to 200° C. A high temperature is used is to assure converting the polyamic acid into a polyimide.

The chemical method includes the use of a chemical imidizing agent, which is used to catalyze the dehydration, or ring closing. Chemical imidization agents such as acetic anhydride and β-picoline can be used. The reaction solvent is not particularly limited so long as it is capable of dissolving the obtained polyimide. The resulting polyimide is then precipitated by adding the polyimide solution to a precipitation solvent such as methanol, ethanol, or water. The solid is washed several times with the solvent, and the precipitate is oven dried.

Applicants determined that certain organic solvents (or mixture of solvents) are particularly suited for both the synthesis of the polyimides and the formation of the polyimide solutions and pastes of the present invention.

These preferred solvents are BLO, γ-valerolactone (GV), α-methyl-γ-butyrolactone (MBL), tetrahydrofurfural acetate, propiophenone, acetophenone, methyl benzoate, phenyl acetate and 2-phenoxyethanol.

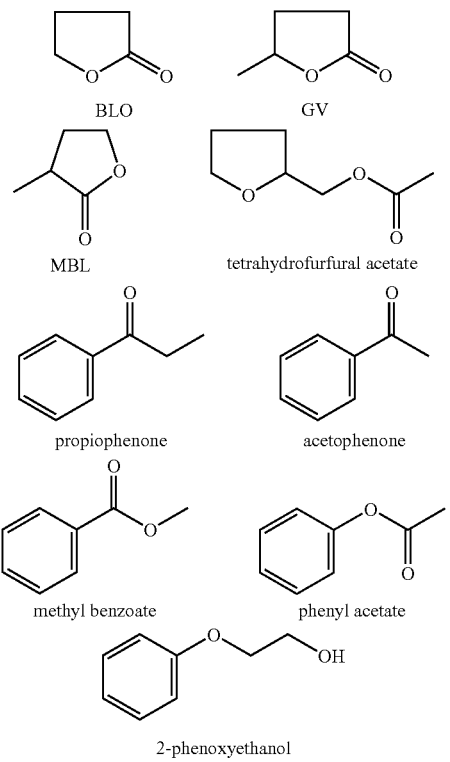

These polyimide pastes can be combined with other materials to produce pastes for screen printable applications in electronic circuitry applications. Some polyimides of the invention that are sufficiently soluble in suitable screen printing solvents are listed in the EXAMPLES 1-17 below.

Another advantage to using the solvents disclosed in the present invention is that in certain embodiments, very little, if any, precipitation of the polyimide is observed when handling a paste composition. Also, the use of a polyamic acid solution may be avoided. Instead of using a polyamic acid, which can be thermally imidized to the polyimide later during processing, an already formed polyimide is used. This allows for lower curing temperatures to be used, temperatures not necessary to convert, to near completion, a polyamic acid to a polyimide. In short, the resulting solutions can be directly incorporated into a liquid or paste composition for coating and screen printing applications without having to cure the polyimide.

Polyimides of the present invention can be made to be crosslinkable by using one or more aromatic diamines with one or more phenolic hydrogens. A preferred aromatic diamine is 3,3'-dihydroxy-4,4'-diaminobiphenyl (HAB). The phenolic functionality reacts with one or more other crosslinking agent during curing. Only a small amount of cross-linking aromatic diamine is needed to provide an improvement in mechanical strength in the cured material. In fact, if too much of the cross-linking diamine is used, the resulting polyimide will tend to have a lower solubility. This is believed in part to the presence of hydrogen bonding of the phenolic functionality with carbonyl functionality on near by polyimide chain.

Paste compositions containing the polyimides of the invention can be used in multiple electronic applications. In one embodiment, the liquid and paste compositions of the invention will include a polyimide with a glass transition temperature greater than 250° C., preferably greater than 290° C., more preferably greater than 310° C. In one embodiment, the compositions will also comprise a polyimide with a water absorption factor of 2% or less, preferably 1.5% or less, and more preferably 1% or less. The polyimides used in the composition will also exhibit a positive solubility measurement in an organic solvent.

Most thick film compositions are applied to a substrate by screen printing, stencil printing, dispensing, doctor-blading into photoimaged or otherwise preformed patterns, or other techniques known to those skilled in the art. These compositions can also be formed by any of the other techniques used in the composites industry including pressing, lamination, extrusion, molding, and the like. However, most thick film compositions are applied to a substrate by means of screen-printing. Therefore, they must have appropriate viscosity so that they can be passed through the screen readily. In addition, they should be thixotropic in order that they set up rapidly after being screened, thereby giving good resolution. Although the rheological properties are of importance, the organic solvent should also provide appropriate wettability of the solids and the substrate, a good drying rate, and film strength sufficient to withstand rough handling.

Curing of the final paste composition is accomplished by any number of standard curing methods including convection heating, forced air convection heating, vapor phase condensation heating, conduction heating, infrared heating, induction heating, or other techniques known to those skilled in the art.

In some applications the use of a crosslinkable polyimide in a liquid or paste composition can provide important performance advantages over the corresponding non-crosslinkable polyimides of the invention. For example, the ability of the polyimide to crosslink with crosslinking agents during a thermal cure can provide electronic coatings with enhanced thermal and humidity resistance. The resulting cross-linked polyimide can stabilize the binder matrix, raise the Tg, increase chemical resistance, or increase thermal stability of the cured coating compositions. Compared to polyimides that contain no crosslinking functionality, slightly lower Tg of the polyimide or slightly higher moisture absorption of the polyimide can be tolerated.

In another embodiment of the present invention, a thermal crosslinking agent is added to the polyimide formulation (typically a polyimide solution) to provide additional crosslinking functionality. A highly cross-linked polymer, after a thermal curing cycle, can yield electronic coatings with enhanced thermal and humidity resistance. The effect of thermal crosslinking agent is to stabilize the binder matrix, raise the Tg of the binder, increase chemical resistance, and increase thermal resistance of the cured, final coating composition.

Preferable thermal crosslinkers useful in the present invention include (1) epoxy resins, which can react with the phenolic functionality in the crosslinkable polyimide; (2) blocked isocyanates that can react with hydroxyls including those resulting from the epoxy-crosslinkable polyimide reaction; and (3) polyhydroxystyrene which can react with the epoxy functionality in the epoxy-containing resin.

Other preferred thermal crosslinking agents are selected from the group consisting of bisphenol epoxy resin, an epoxidized copolymer of phenol and aromatic hydrocarbon, a polymer of epichlorohydrin and phenol formaldehyde, and 1,1,1-tris(p-hydroxyphenyl)ethane triglycidyl ether.

The liquid or paste compositions of the present invention can also further include a hydroxyl-capping agent. A hydroxyl-capping agent is believed to provide additional solution stability. A blocked isocyanate agent can be used as a hydroxyl-capping agent.

The different coating compositions for electronic coating applications require different functional fillers that allow the required electrical, thermal or insulator property to be obtained. Functional fillers for resistors and other electrical conductors include, but are not limited to, one or more metals or metal oxides (e.g., ruthenium oxides and the other resistor materials described in U.S. Pat. No. 4,814,107, the entire disclosure of which is incorporated herein by reference.)

As used herein, the term "metal oxide" is defined as a mixture of one or more metals with an element of Groups IIIA, IVA, VA, VIA or VIIA. In particular, the term metal oxides also includes, metal carbides, metal nitrides, and metal borides.

Functional fillers for capacitors include, but are not limited to, barium titanate, lead magnesium niobate, and titanium oxide. Functional fillers for encapsulants include, but are not limited to, fumed silica, alumina, and titanium dioxide. Encapsulant compositions can be unfilled, with only the organic binder system used, which has the advantage of providing transparent coatings for better inspection of the encapsulated component. Functional fillers for thermally conductive coatings include, but are not limited to barium nitride, aluminum nitride, boron nitride, aluminum oxide, graphite, beryllium oxide, silver, copper, and diamond.

PTF materials have received wide acceptance in commercial products, notably for flexible membrane switches, touch keyboards, automotive parts and telecommunications. These compositions contain resistive filler material dispersed with the polyimides of the invention. The compositions can be processed at relatively low temperatures, namely the temperatures needed to remove the solvents in the composition and cure the polyimide binder system, for crosslinkable polyimide compositions. The actual resistivity/conductivity required for the resulting resistors will vary depending on the electronic application.

The resistive elements are usually prepared by printing the PTF composition, or ink, onto a sheet in a pattern. It is important to have uniform resistance across the sheet (i.e. the resistance of elements on one side of the sheet should be the same as that of elements on the opposite side). Variability in the resistance can significantly reduce the yield.

In addition, the resistive element should be both compositionally and functionally stable. Obviously, one of the most important properties for a resistor is the stability of the resistor over time and under certain environmental stresses. The degree to which the resistance of the PTF resistor changes over time or over the lifetime of the electronic device can be critical to performance. Also, because PTF resistors are subject to lamination of inner layers in a printed circuit board, and to multiple solder exposures, thermal stability is needed. Although some change in resistance can be tolerated, generally the resistance changes need to be less than 5%.

Resistance can change because of a change in the spacing or change in volume of functional fillers, i.e., the resistor materials, in the cured PTF resistor. To minimize the degree of volume change, the polyimide should have low water absorption so the cured polyimide based material does not swell when exposed to moisture. Otherwise, the spacing of the resistor particles will change resulting in a change in resistance.

Resistors also need to have little resistance change with temperature in the range of temperatures the electronic device is likely to be subjected. The thermal coefficient of resistance must be low, generally less than 200 ppm/° C.

The polyimides of the invention and compositions containing the polyimides are especially suitable for providing polymer thick film (PTF) resistors. The PTF resistors made from the inventive polyimides and corresponding compositions exhibit exceptional resistor properties and are thermally stable even in relatively high moisture environments. For example, many of the compositions containing the polyimides of the invention do not exceed a change of resistance of about 10%. Most compositions do not exceed a change of resistance of about 5%.

To provide PTF resistors that exhibit a small change in resistance due to heat and moisture, the polyimides of the invention will have a relatively high Tg and relatively low moisture absorption. Applicants determined that the most stable polymer matrix is achieved with the use of crosslinkable, high Tg binders that also have low moisture absorption of less than 2%, preferably less than 1.5%, more preferably less than 1%.

An additional approach found to be helpful is to treat the functional filler with a surface agent (e.g. an organo-silane) prior to combining the filler with the polyimide solution. The silane agent, γ-aminopropyltriethoxysilane, was particularly useful in the treatment of metal oxide functional fillers used in PTF resistor compositions of the invention. The silane is believed to react with the oxide surface forming a covalent bond, and the pendant amino group is believed to react with the crosslinking agent. The silane agent effectively increases the crosslinking of the polymeric binder in the cured material thus stabilizing the particle components in the PTF resistor. The result is a PTF resistor with improved performance during thermal and high humidity aging and accelerated testing. Surface treatment with a silane agent can also improve the dispersion of the functional fillers in the polyimide solution. Organo-titanates, zirconates, aluminates, could also be used as a surface agent to enhance the properties of a PTF resistor.

The liquid or paste compositions of the present invention can further include one or more metal adhesion agents. Preferred metal adhesion agents are selected from the group consisting of polyhydroxyphenylether, polybenzimidazole, polyetherimide, and polyamideimide. Typically, these metal adhesion agents are dissolved in the polyimide solutions of the present invention.

For PTF resistors, the addition of a phenoxy resin (e.g. PKHH-polyhydroxyphenyl ether) was unexpectedly found to improve adhesion to chemically cleaned copper. This was found to greatly improve the performance of PTF resistors to solder exposure and to accelerated thermal aging. Both thermal cycling from −25° C. to +125° C., and for 85° C./85% RH thermal cycling performance was significantly improved. The combination of the polyimides and the phenoxy resin improved PTF resistors sufficiently that the expensive multi-step immersion silver treatment of the copper was not necessary.

In addition, the adhesion promoter, 2-mercaptobenzimidazole (2-MB), was found to slightly improve stability of PTF resistors to solder exposure, especially at high loadings of the functional filler.

The polyimides of the invention can also be dissolved into a solution and used in IC and wafer-level packaging as semiconductor stress buffers, interconnect dielectrics, protective overcoats (e.g., scratch protection, passivation, etch mask, etc.), bond pad redistribution, alignment layers for a liquid crystal display, and solder bump under fills. One advantage of the pre-imidized materials of the present invention (versus a polyamic acid-type paste) is the lower curing temperature needed in downstream processing. Current packaging requires a cure temperature of about 300° C.+/−25° C.

The advantages of the materials present invention are illustrated in the following EXAMPLES. Processing and test procedures used in preparation of, and testing, of the polyimides of the present invention (and compositions containing these polyimides) are described below.

3 Roll Milling

A three-roll mill is used for grinding pastes to fineness of grind (FOG) generally <5μ. The gap is adjusted to 1 mil before beginning. Pastes are typically roll-milled for three passes at 0, 50, 100, 150, 200, 250 psi until FOG is <5μ. Fineness of grind is a measurement of paste particle size. A small sample of the paste is placed at the top (25μ mark) of the grind gauge. Paste is pushed down the length of the grind gauge with a metal squeegee. FOG is reported as x/y, where x is the particle size (microns) where four or more continuous streaks begin on the grind gauge, and y is the average particle size (micron) of the paste.

Screen-printing

A 230 or 280 mesh screen and a 70-durometer squeegee are used for screen-printing. Printer is set up so that snap-off distance between screen and the surface of the substrate is typically 35 mils for an 8 in×10 in screen. The downstop (mechanical limit to squeegee travel up and down) is preset to 5 mil. Squeegee speed used is typically 1 in/second, and a print-print mode (two swipes of the squeegee, one forward and one backward) is used. A minimum of 20 specimens per paste is printed. After all the substrates for a paste are printed, they are left undisturbed for a minimum of 10 minutes (so that air bubbles can dissipate), then cured 1 hr at 170° C. in a forced draft oven.

Solder Float

Samples are solder floated in 60/40 tin/lead solder for 3 times for 10 seconds each, with a minimum of 3 minutes between solder exposures where the samples are cooled close to room temperature.

85° C./85% RH Testing

A minimum of three specimens that have not been cover coated are placed in an 85° C./85% RH chamber and aged for 125, 250, 375 and 500 hr at 85/85. After exposure time is reached, samples are removed from the chamber, oxidation is removed from the copper leads with a wire brush and the resistance promptly determined.

Thermal Cycling

Samples of cured resistors that have not been cover coated, are subjected to thermal cycling from −25° C. to +125° C. for 150 to 200 cycles with heating and cooling rates of 10° C./min with samples held at the extreme temperatures for 30 min.

ESD

Samples of cured resistor are exposed to 5,000 instantaneous volts of electricity five times. Voltage is decreased to 2,000 volts and the sample is exposed to 10 repetitions. The resistance change (as a resistor) is measured.

TCR

TCR (thermal coefficient of resistance) is measured and reported in ppm/° C. for both hot TCR (HTCR) at 125° C. and cold TCR (CTCR) at −40° C. A minimum of 3 specimens for each sample, each containing 8 resistors, is used. The automated TCR averages the results.

Thermal Conductivity Measurement

A film ~0.3 mm is prepared on releasing paper by solution cast, followed by drying at 170° C. for 1 hour. A 1" diameter puncher is used to cut the sample into the right size. For the thermal conductivity determination a laser flash method is used to determine the thermal conductivity. Samples are sputtered with ~200 Å of Au layer in order to block the laser flash being seen by the IR detector during the measurement. The gold coating is then sprayed with three coats of micronically fine synthetic graphite dispersion in Fluron. The graphite coating increases the absorption of radiation on the laser side of the sample, and increases the emission of radiation on the detector side.

The specific heat is determined first by comparing with that of a standard (Pyrex 7740), and then corrected by subtracting those of gold and graphite coatings. The bulk density is calculated based on the formulation. Thermal diffusivity in the unit of cm/s is obtained via a Netzsh laser flash instrument. The thermal conductivity is calculated as:

Conductivity=(Diffusivity×Density×Specific Heat)

Temperature is controlled at 25° C. via a Neslab circulating batch. Scan time is set at 200 ms with an amperage gain of 660 for Pyrex standard and 130-200 second and 600 gain for the sample. A Nd:glass laser of 1060 nm and pulse energy of 15 J and pulse width of 0.33 ms is used. Three laser shots are taken for each sample.

Stability of Polyimide Solutions in the Presence of Water Vapor 0.4 to 0.5 grams of 10% solids solutions of the polyimide are placed in a 1 inch diameter watch glass and placed in a 130 mm diameter desiccator that contains an aqueous saturated solution of ammonium sulfate which gives 75% to 85% RH in the closed container. The samples are observed and the time where the sample becomes cloudy or opaque or when a ring of precipitated polymer is recorded. The polyimide sometimes precipitates on the outside edge first where the solution depth is the least, and with time precipitation occurs across the entire sample. Polyimide solutions that resist precipitation for the longest time will yield paste compositions with the longest self-life stability to high humidity conditions. A hygrometer from Extech Instruments is placed in the desiccator to monitor the % RH.

Polyimide Film Moisture Absorption Test

The ASTM D570 method is used where polyimide solution is coated with a 20-mil doctor knife on a glass plate. The wet coating is dried at 190° C. for about 1 hour in a forced draft oven to yield a polyimide film of 2 mils thickness. In order to obtain a thickness of greater than 5 mils as specified by the test method, two more layers are coated on top of the dried polyimide film with a 30 min 190° C. drying in a forced draft oven between the second and third coating. The three layer coating is dried 1 hr at 190° C. in a forced draft oven and then is dried in a 190° C. vacuum oven with a nitrogen purge for 16 hrs or until a constant weight is obtained. The polyimide film is removed from the glass plate and cut into one inch by 3-inch strips. The strips are weighed and immersed in deionized water for 24 hrs. Samples are blotted dry and weighed to determine the weight gain so that the % water absorption can be calculated.

EXAMPLE 1

A polyimide solution, where the polyimide is derived from DSDA dianhydride and a combination of TFMB and HAB diamine (at a ratio of 0.95:0.5 respectively), was prepared using gamma-butyrolactone (GV) as the solvent.

To a dry, three-neck round bottom flask equipped with nitrogen inlet, mechanical stirrer, Dean Stark trap, and condenser was added 85.0 grams of gamma-butyrolactone solvent (GV), 8.933 grams of 2,2'-Bis(trifluoromethyl)benzidine (TFMB) and 0.313 grams 3,3'-dihydroxy-4,4'-diaminobiphenyl (HAB).

After one hour of stirring the solution at room temperature, 10.61 grams of 3,3',4,4'-diphenylsulfone tetracarboxylic dianhydride (DSDA) were added to form a polyamic acid solution. The polyamic acid solution reached a temperature of 29° C. The solution was stirred without heating for 15 hrs.

16.38 grams of toluene were added to the Dean Stark trap. 17.25 grams of toluene were added to the polyamic acid solution. The solution was then heated in an oil bath, set at 180° C., to convert the polyamic acid to a polyimide.

After no more product water was collected in the trap (the water formed during an imidization reaction), the toluene was distilled off. This allowed the reaction temperature to rise to between 165° C. and 170° C. The polyimide solution was stirred in this temperature range for four hours.

The polyimide solution was cooled to room temperature to yield 90 grams of 19.9% polyimide solids dissolved in GV solvent. The polyimide solution had a viscosity of 116 Pa×sec.

The molecular weight of the polyimide polymer was obtained by size exclusion chromatography using polystyrene standards. The number average molecular weight of the polyimide was 61,300. The weight-average molecular weight was 255,300.

The glass transition temperature (Tg) of the polyimide was measured to be 330° C. The percent moisture absorption factor (using test ASTMD570) of a 6-mil thick polyimide film made from this polymer was 1.5%.

EXAMPLES 2-17

The polyimide solutions, and polyimides, of EXAMPLES 2-17 were prepared in the same manner as EXAMPLE 1 with the exception that the corresponding dianhydrides and diamines(s) were selected from Table 1 below. In some cases, 5 mole percent of the diamine component was HAB.

The solutions were first prepared in DMAc. The polyimides were prepared using a chemical imidization process, the polyimides precipitated out in methanol and then dried. The polyimides were then re-dissolved in BLO solvent. All of these polymer solutions were soluble at 15-20 weight percent in BLO solvent.

TABLE 1

| Example | Dianhydride | Diamines(s)* |
|---------|-------------|--------------|
| 2 | DSDA | BAPS:HAB |
| 3 | DSDA | 3,4'-ODA |
| 4 | DSDA | MPD |
| 5 | DSDA | BAPP:HAB |
| 6 | DSDA | FDA:HAB |
| 7 | 6-FDA | 3,4'-ODA:HAB |
| 8 | 6-FDA | 3,4'-ODA |

TABLE 1-continued

| Example | Dianhydride | Diamines(s)* |
|---|---|---|
| 9 | 6-FDA | 6-F-BAPD |
| 10 | 6-FDA | TFMB:HAB |
| 11 | 6-FDA | TFMB |
| 12 | ODPA | TFMB:HAB |
| 13 | ODPA | FDA:HAB |
| 14 | ODPA | FDA |
| 15 | ODPA | 3,3'-DDS |
| 16 | DSDA | TFMB |
| 17 | ODPA | TFMB |

*The mole ratio of the primary diamine with HAB is 0.95:0.05

EXAMPLES 18-29

The following EXAMPLES are polyimide solutions prepared from the polymers described in EXAMPLES 2-17. Instead of re-dissolving the polyimide in BLO solvent, each polymer was re-dissolved in the solvents listed in Table 2.

Each polyimide solution was rated subjectively from one to ten, ten being the best and one being the worst. The time that the polyimide polymer remained in solution when the solution was exposed to high humidity was recorded as the time to precipitation.

TABLE 2

| Examples | Solvent | Rating[a] | Time to precipitation |
|---|---|---|---|
| 18. DSDA//TFMB/HAB | BLO | 3-4 | 10-20 hrs. |
| 19. DSDA//TFMB/HAB | MBL | 10 | >8 days |
| 20. DSDA//TFMB/HAB | γ-valerolactone | 3-4 | 21 hrs. |
| 21. DSDA//TFMB/HAB | THFA | 10 | >7 days |
| 22. DSDA//TFMB/HAB | Propiophenone | 10 | >7 days |
| 23. DSDA//TFMB/HAB | Acetophenone | 10 | >7 days |
| 24. DSDA//TFMB | MBL | 10 | >7 days |
| 25. DSDA//TFMB | BLO | 3 | 8 hrs. |
| 26. 6-FDA//3,4'-ODA/HAB | MBL | 10 | >8 days |
| 27. ODPA//TFMB/HAB | MBL | 10 | >8 days |
| 28. 6-FDA//TFMB/HAB | MBL | 10 | >8 days |
| 29. ODPA//TFMB | BLO | 3 | 8 hrs. |

[a]Rating to Rank Results before Precipitation
1 = ≦1 hr
2 = 1-4 hrs
3 = 4-8 hrs
4 = 1 day
5 = 2 days
6 = 3 days
7 = 4 days
8 = 5 days
9 = 6 days
10 = 1 week Names of Solvents
BLO    γ-butyrolactone
DGME  diethylene glycol methyl ether
MBL   α-methyl-γ-butyrolactone
NMP   N-methyl-2-pyrrolidinone
THFA  tetrahydrofurfural acetate

EXAMPLE 30

A PTF resistor paste composition was prepared using the polyimide solution of EXAMPLE 1. This was performed by adding, to the polyimide solution, the additional components listed below.

The PTF resistor paste included one or more metal powders (or metal oxides), additional thermal crosslinkers, and an adhesion-promoting phenoxy resin. The PTF resistor paste composition was prepared by mixing the following ingredients in an ambient environment with stirring to give a crude paste mixture.

| Ingredient | % by weight |
|---|---|
| Ruthenium dioxide powder | 25.73 |
| Bismuth ruthenate powder | 18.65 |
| Silver powder | 5.98 |
| Alumina powder | 5.32 |
| Polyimide solution | 39.08 |
| Phenoxy resin PKHH solution | 2.83 |
| Epon® 828 | 0.75 |
| Desmodur® BL3175A solution | 1.35 |
| 2-ethyl-4-methylimidazole | 0.05 |
| 2-MB | 0.26 |

4.38 grams of BLO solvent was then added to facilitate mixing of the paste composition to yield a 54.9 percent by weight solids paste mixture.

EXAMPLE 31

The PTF resistor paste of EXAMPLE 30 was used to prepare the PTF resistor of EXAMPLE 31.

The PTF resistor paste was printed directly onto chemically cleaned copper without a silver immersion process. Silver immersion processes are typically used to pre-treat a copper surface.

The PTF resistor paste was 3-roll milled with a 1 mil gap with 3 passes each set at 0, 50, 100, 200, 250 and 300 psi pressure to yield a fineness of grind of 4/2. The paste was screen-printed using a 280-mesh screen, a 70-durometer squeegee, on print-print mode, at 10-psi squeegee pressure, on chemically cleaned FR-4 substrates, and with a 40 and 60 mil resistor pattern.

The samples were baked in a forced draft oven at 170° C. for 1 hr. The properties of the resulting cured PTF resistor were recorded as follows:

| | |
|---|---|
| Resistance (ohm/square) | 67 |
| Thickness (microns) | 12 |
| HTCR (ppm/° C.) | 138 |
| CTCR (ppm/° C.) | −47 |
| % resistance change of 40 mil resistors after: | |
| 288° C. solder with three 10 second floats | 8.6 |
| 500 hrs at 85° C./85% RH | 3.5 |
| Thermal cycling (−25° C. to 125° C.) | −11.6 |
| ESD (5 pulses at 5,000 v) | −0.17 |

EXAMPLE 32

EXAMPLE 32 illustrates the use of a high Tg crosslinkable polyimide used in a PTF resistor paste composition similar to EXAMPLE 30, and a resistor composition similar to EXAMPLE 31.

A polyimide solution was prepared in a similar manner as Example 1. However, the polyamic acid was chemically imidized by the following method below.

To a dry three neck round bottom flask equipped with nitrogen inlet, mechanical stirrer and condenser was added 850 grams of DMAC, 79.75 grams of 3,3',4,4'-diphenylsulfone tetracarboxylic dianhydride (DSDA) and 2.408 grams 3,3'-dihydroxy-4,4'-diaminobiphenyl (HAB).

To the stirred solution, at room temperature, was added in parts (over 60 min.) 67.67 grams of 2,2'-Bis(trifluoromethyl) benzidine (TFMB).

The polyamic acid solution reached a temperature of 33° C. It was stirred without heating for 16 hrs. 90.9 grams of acetic anhydride were added followed by 83.95 grams of 3-picoline. The solution was heated to 80° C. for 1 hour.

The solution was cooled to room temperature, and was added to an excess of methanol in a blender to precipitate the product polyimide. The solids were collected by filtration. The solids were washed 3 times by re-blending the solids in methanol.

The polymer was dried in a vacuum oven with a nitrogen purge at 190° C. for 4 hrs to yield 138.4 grams of polyimide having a number average molecular weight of 56,800 and a weight average molecular weight of 140,700. The Tg of the polyimide Tg was 330° C. The moisture absorption was measured to be 1.5%.

The polyimide was re-dissolved in BLO solvent to form a ~20 weight percent polyimide solution.

A PTF resistor paste was prepared by adding the component listed below.

| Ingredient | % by weight |
| --- | --- |
| Ruthenium dioxide powder | 18.20 |
| Gadolinium bismuth ruthenate powder | 22.96 |
| Silver powder | 5.39 |
| Alumina powder | 4.82 |
| Polyimide solution | 42.90 |
| Phenoxy resin PKHH solution | 3.10 |
| Epon ® 828 | 0.83 |
| Desmodur ® BL3175A solution | 1.51 |
| 2-ethyl-4-methylimidazole | 0.05 |
| 2-MB | 0.24 |

The PTF resistor paste was diluted with the addition of 4.38 grams of BLO to yield 54.9 weight percent solids.

The paste was roll milled with a 1-mil gap with 3 passes each at 0, 50, 100, 200, 250 and 300 psi to yield a fineness of grind of less than 5/2 micron.

The resistor paste was directly printed on chemically cleaned copper. It was shown to give excellent resistor properties.

Again, the immersion silver pre-treatment was not needed to provide a PTF resistor with excellent properties and with a resistance of about 1 Kohm/square. The paste was screen-printed using a 280-mesh screen, and a 70-durometer squeegee, print-print mode, at 10-psi squeegee pressure on chemically cleaned FR-4 substrates with a 40 and 60 mil resistor pattern. The samples were baked in a forced draft oven at 170° C. for 1 hr.

The properties of the cured PTF resistor were:

| Resistance (ohm/square) | 1,260 |
| --- | --- |
| Thickness (microns) | 11.4 |
| HTCR (ppm/° C.) | −120 |
| CTCR (ppm/° C.) | −283 |
| % resistance change of 40 mil resistors after: | |
| 288° C. solder with three 10 second floats | 0.5 |
| ESD (5 pulses at 5,000 v) | 2.4 |

EXAMPLE 33

This example illustrates the use of fillers that produced using a silane treatment coating method. These filler resistor materials are useful in the crosslinkable-polyimide PTF resistor compositions of the present invention.

A polyimide was prepared similar to the method of EXAMPLE 1. However, the polyamic acid was chemically imidized by the following method.

To a dry three neck round bottom flask equipped with nitrogen inlet, mechanical stirrer and condenser was added 850 grams of DMAc, 79.8 grams of 3,3'-,4,4'-diphenylsulfone tetracarboxylic dianhydride (DSDA) and 2.404 grams 3,3'-dihydroxy-4,4'-diaminobiphenyl (HAB).

To the stirred solution at room temperature was added in parts over 70 min 67.82 grams of 2,2'-Bis(trifluoromethyl) benzidine (TFMB). The solution of polyamic acid reached a temperature of 33° C. and was stirred without heating for 18 hrs. 91.02 grams of acetic anhydride was added followed by 83.03 grams of 3-picoline and the solution was heated to 80° C. for 1 hour.

The polyimide solution was cooled to room temperature, and the solution added to an excess of methanol in a blender to precipitate the product polyimide. The solids were collected by filtration. The solids were washed 3 times by re-blending the solid in methanol.

The product was dried in a vacuum oven with a nitrogen purge at 190° C. for 4 hrs to yield 139.0 grams of product having a number average molecular weight of 73,900 and a weight average molecular weight of 29,900. The Tg of the polyimide Tg was 330° C. and the moisture absorption factor was 1.5%. The polyimide was re-dissolved in BLO solvent to form a ~20 weight percent polyimide solution.

The inorganic resistor materials were pre-treated with A1110 aminopropyltriethoxy silane prior to making the resistor paste. 1.5 grams of A1110 were dissolved by shaking in 50 grams of 95/5 ethanol/deionized water. Within 10 min this was applied to 150 grams of the inorganic resistor materials in a mortar. The wet powders were ground until the silane was well dispersed. The powders were dried overnight at 60° C.

A PTF resistor paste was prepared by adding to the polyimide solution the ingredients listed below.

| Ingredient | % by weight |
| --- | --- |
| Ruthenium dioxide powder | 23.15 |
| Bismuth ruthenate powder | 16.83 |
| Silver powder | 5.36 |
| Alumina powder | 4.82 |
| Polyimide solution | 42.87 |
| Phenoxy resin PKHH solution | 3.75 |
| Epon ® 828 | 1.61 |
| Desmodur ® BL3175A solution | 1.50 |
| 2-ethyl-4-methylimidazole | 0.11 |

The PTF resistor paste was diluted with the addition of 4.38 grams of BLO to yield 54.9 weight percent solids. The mixture was roll milled with a 1-mil gap with 3 passes each at 0, 50, 100, 200, 250 and 300 psi to yield a fineness of grind of 7/4.

The paste was screen-printed using a 280-mesh screen, and a 70-durometer squeegee, print-print mode, at 10-psi squeegee pressure on FR-4 substrates with a 40 and 60 mil resistor pattern. The resistor paste was directly printed on FR-4 copper resistor patterns that were not chemically cleaned prior to screen-printing. The samples were baked in a forced draft oven at 170° C. for 1 hr. The properties of the cured resistors indicating excellent thermal performance were:

| | |
|---|---|
| Resistance (ohm/square) | 216 |
| Thickness (microns) | 9.3 |
| HTCR (ppm/° C.) | 96 |
| CTCR (ppm/° C.) | −116 |
| % resistance change of 40 mil resistors after: | |
| 288° C. solder with three 10 second floats | −3.1 |
| 200 hrs at 85° C./85% RH | −1.8 |
| Thermal cycling (200 cycles −25° C. to 125° C.) | −2.3 |

EXAMPLE 34

This EXAMPLE illustrates the utility of using a polyimide formulation having a low-moisture absorption factor to prepare a PTF capacitor composition.

A thermally imidized polyimide was prepared similar to the method of EXAMPLE 1 but the polyamic acid was chemically imidized by the following method.

To a dry, three-neck round bottom flask equipped with nitrogen inlet, mechanical stirrer and condenser was added 700 grams of DMAc. Then 45.98 grams 3,4'-oxydianiline was added to the flask and dissolved in the DMAc by gentle agitation at room temperature. After complete solvation, 100 grams of 2,2'-bis-(3,4-dicarboxyphenyl)hexafluoropropane dianhydride (6FDA) was added to the stirring solution in parts over a 10 minute period. A slight exothermic reaction was observed.

The solution of polyamic acid was stirred without heating for 2 hours. At this point, 90.9 grams of acetic anhydride was added to the viscous solution followed by 83.95 grams of 3-picoline and the solution was heated to 80° C. for 1 hour.

During this time, the color of the solution was observed to change from light yellow to orange. The polyimide solution formed was cooled to room temperature, and the solution added to an excess of methanol in a blender to precipitate the product polyimide.

The fibrous solids were collected by filtration. The solids were washed 3 times by re-blending the solid in methanol. The product was dried in a vacuum oven with a nitrogen purge at 190° C. for 4 hrs to yield 110 grams of polyimide with Tg of 275° C., and a water absorption of 0.6%.

A capacitor paste was formed from the following ingredients.

| Ingredient | % by weight |
|---|---|
| Barium titanate powder | 45.45 |
| Polyimide powder | 8.00 |
| BLO solvent | 46.55 |

The polyimide powder was re-dissolved in the BLO solvent with heating to 60° C.

The paste was roll milled to a fineness of grind of 8/5. The paste was screen printed on patterned copper FR-4 patterns, and cured at 160° C. for 1 hr. A copper-based conductor paste was printed on the cured dielectric and cured at 150° C. for 30 min to yield capacitors with the following properties:

| Property | Value |
|---|---|
| Capacitance | 12.3 nF/in$^2$ |
| Thickness | 15.3 microns |
| Apparent dielectric constant | 33.6 |
| Loss factor | 1.5% |
| Breakdown voltage | >1000 at 15 microns |
| % capacitance drift 200 hrs 85° C./85% RH | 6.8 |
| % capacitance drift 3 × 10 sec 288° C. solder float | −4.7 |

EXAMPLE 35

This EXAMPLE illustrates using a high Tg polyimide with low moisture absorption with the addition of a phenoxy resin to obtain a PTF heat conductive composition.

A chemically imidized polyimide solution was prepared similar to the method of EXAMPLE 1.

To a dry, three-neck round bottom flask equipped with nitrogen inlet, mechanical stirrer, Dean Stark trap, and condenser was added 360.2 grams of gamma-butyrolactone, 40.96 grams of gamma-valerolactone (GV), 44.7 grams of 2,2'-Bis(trifluoromethyl)benzidine (TFMB) and 1.6 grams 3,3'-dihydroxy-4,4'-diaminobiphenyl (HAB).

To the stirred solution at room temperature was added in parts over 60 min 53.09 grams of 3,3',4,4'-diphenylsulfone tetracarboxylic dianhydride (DSDA).

The polyamic acid solution reached a temperature of 30° C. It was stirred without heating for 20 hrs.

19.07 grams of toluene were added to the Dean Stark trap and 21.2 grams of toluene, and 10 drops of isoquinoline, were added to the polyamic acid solution. The solution was then heated in an oil bath set at 180° C. to convert the polyamic acid to a polyimide.

After no more product water was collecting in the trap, the toluene was distilled off, allowing the reaction temperature to rise to 169° C., and the solution was stirred at this temperature for 4 hrs. The polyimide solution was cooled to room temperature to yield 470 grams of 19.6% solids solution having a viscosity of 60 Paxsec at 10 rpm.

The molecular weight of the polyimide was obtained by size exclusion chromatography using polystyrene standards. The number average molecular weight was 36,600 and the weight average molecular weight was 141,500. The polyimide Tg is 330° C. and the moisture absorption was 1.5%.

A PTF heat conductive composition paste was formed by combining the following ingredients:

| Ingredient | % by weight |
|---|---|
| Aluminum nitride powder | 47.63 |
| Polyimide solution | 42.26 |
| Phenoxy resin PKHH solution | 3.02 |
| Epon ® 828 | 0.81 |
| Desmodur ® BL3175A solution | 1.47 |
| 2-ethyl-4-methylimidazole | 0.05 |
| BLO/GV (90/10) | 4.76 |

Results including the thermal diffusivity half time ($t_{50}$) are shown in the following chart.

| Diameter (mm) | Density (g/cm$^3$) | Thickness (mm) | $t_{50}$ (s) | Cp (J/gK) | Diffusivity (cm$^2$/s) | Conductivity (W/mK) |
|---|---|---|---|---|---|---|
| 12.7 | 1.645 | 0.3345 | 0.0115 | 0.7435 | 0.01371 | 1.674 |

Comparative Examples 1-7

Polyimide solutions believed to be stable in humid environments in the solvents listed below were surprisingly discovered to not have sufficient solubility for screen-printable paste applications. These compositions are shown in the COMPARATIVE EXAMPLES 1-7 below.

The polyimides of these COMPARATIVE EXAMPLES were prepared using the methods illustrated in EXAMPLES 2-17.

The polyimide solutions described in Table 3 below have a dianhydride(s) and diamine(s) in column 1, a solvent in column 2, a subjective rating in column 3, and the time measured to precipitation, in a humid environment, in column 4.

TABLE 3

| Comparative Examples 1-7 | Solvent | Rating$^a$ | Time to precipitation |
|---|---|---|---|
| 1. DSDA//TFMB/HAB | NMP | 2 | 2 hrs |
| 2. DSDA//TFMB/HAB | DGME | 1 | 1 hr |
| 3. DSDA//BAPP | MBL | 2 | 2 hr |
| 4. DSDA//BAPP | BLO | 2 | 1.5 hrs |
| 5. DSDA//BAPP/HAB | MBL | 2 | 2.75 hrs |
| 6. DSDA//BAPP/HAB | MBL | 2 | 2.75 hrs |
| 7. ODPA/BAPP | NMP | 1 | 15 minutes |

$^a$Rating to Rank Results before Precipitation
1 = ≦1 hr
2 = 1-4 hrs
3 = 4-8 hrs
4 = 1 day
5 = 2 days
6 = 3 days
7 = 4 days
8 = 5 days
9 = 6 days
10 = 1 week Names of Solvents
BLO γ-butyrolactone
DGME diethylene glycol methyl ether
MBL α-methyl-γ-butyrolactone
NMP N-methyl-2-pyrrolidinone
THFA tetrahydrofurfural acetate Comparative Examples 8-20

Non-crosslinkable and crosslinkable polyimides, that were expected to be soluble but were instead found to not have sufficient solubility for screen-printing, are shown below. The polyimide were produced in DMAc solvent and then dried.

The polyimides des were then re-dissolved in BLO solvent at 15-20 weight percent to evaluate them as useful solutions (a component to make for example a resistor paste) in screen-printable pastes.

Surprisingly these polymers were not soluble enough for screen-printing paste applications. The time to precipitation for each solution was less than one hour. These COMPARATIVE EXAMPLES were prepared in accordance with EXAMPLES 1-17 and the dianhydrides and diamines used to prepare the polyimides are listed below.

TABLE 4

| Comparative Examples | Dianhydride(s) | Diamine(s) |
|---|---|---|
| 8 | BPDA | BAPP |
| 9 | BPDA | TFMB |
| 10 | PMDA | BAPP |
| 11 | PMDA | m-BAPS |
| 12 | PMDA | BAPP |
| 13 | ODPA | MPD |
| 14 | ODPA | 3,4'-ODA |
| 15 | 6-FDA | ODA |
| 16 | BPDA | TFMB |
| 17 | 6-FDA:BPDA (0.5:0.5)* | 3,4'-ODA |
| 18 | Ultem DA | 3,4'-ODA:HAB (0.95:0.05)* |
| 19 | ODPA | BAPP:HAB (0.95:0.05)* |
| 20 | ODPA | BAPP |

*Numbers in parentheses indicates relative mole ratios

Comparative Example 21

Commercially available Asahi PTF resistor paste TU-100-8 was screen-printed as in EXAMPLE 31 on chemically cleaned copper and cured at 170° C. for 1 hr. The properties of the resulting cured resistor were:

| | |
|---|---|
| Resistance (ohm/square) | 50 |
| Thickness (microns) | 30 |
| HTCR (ppm/° C.) | −359 |
| CTCR (ppm/° C.) | −172 |
| % resistance change of 40 mil resistors after: | |
| 288° C. solder with three 10 second floats | −10.2 |
| 500 hrs at 85° C./85% RH | 62 |
| Thermal cycling (−25° C. to 125° C.) | 4.0 |
| ESD (5 pulses at 5,000 v) | −2.6 |

Glossary of Terms

The following glossary contains a list of names and abbreviations for each ingredient used:

| | |
|---|---|
| Phenoxy resin PKHH solution | Polyhydroxyphenyl ether from InChem Corp. dissolved at 23.89% solids in 70/30 Dowanol ® DPM/diethylene glycol ethyl ether acetate |
| Epon ® 828 | Bisphenol A/epichlorohydrin based epoxy resin from Shell |
| Desmodur ® BL3175A solution | Blocked isocyanate from Bayer Polymers LLC at 75% solids in AR100 |
| 2-ethyl-4-methylimidazole | Catalyst for epoxy reaction from Aldrich |
| 2-mercaptobenzimidazole (2-MB) | Adhesion promoter from Aldrich |
| Ruthenium dioxide (P2456) | Resistor material made in DuPont Microcircuit Materials; surface area 12 m$^2$/g |
| Bismuth ruthenate (P2280) | Resistor material made in DuPont Microcircuit Materials; surface area 9-10 m$^2$/g |
| Gadolinium bismuth ruthenate (P2271) | Resistor material made in DuPont Microcircuit Materials; surface area 2-2.7 m$^2$/g |

-continued

| | |
|---|---|
| Silver (P3023) | Resistor material made in DuPont Microcircuit Materials; surface area 2.2-2.8 m²/g |
| Alumina (R0127) | Non-electrically conductive filler; surface area 7.4 to 10.5 m²/g |
| Barium titanate (Z9500) | Capacitor material from Ferro; surface area 3.6 m²/g, average particle size 1.2 microns |
| Aluminum nitride | Thermally conductive material from Alfa Aesar; <4 microns average particle size |
| Fumed silica (R972) | Viscosity modifier from Degussa; surface area 90-130 m²/g |

What is claimed is:

1. A polyimide based composition consisting essentially of a polyimide component and an organic solvent, the polyimide component being represented by formula I:

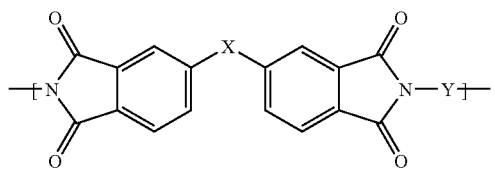

I wherein X is O, $S(O)_2$, $C(CF_3)_2$, or a mixture of two or three of O, $S(O)_2$, and $C(CF_3)_2$;
wherein Y is diamine component selected from the group consisting of m-phenylenediamine (MPD), 3,4'-diaminodiphenyl ether (3,4'-ODA), 4,4'-diamino-2,2'-bis(trifluoromethyl)biphenyl (TFMB), 3,3'-diaminodiphenyl sulfone (3,3'-DDS), bis-(4-(4-aminophenoxy)phenyl) sulfone (BAPS) or 9,9-bis(4-aminophenyl)fluorene (FDA);
with the proviso that:
  i. if X is O, then Y is not m-phenylenediamine (MPD), bis-(4-(4-aminophenoxy)phenyl)sulfone (BAPS) and 3,4'-diaminodiphenyl ether (3,4'-ODA);
  ii. if X is $S(O)_2$, then Y is not 3,3'-diaminodiphenyl sulfone (3,3'-DDS);
  iii. if X is $C(CF_3)_2$, then Y is not m-phenylenediamine (MPD), bis-(4-(4-aminophenoxy)phenyl)sulfone (BAPS), 9,9-bis(4-aminophenyl)fluorene (FDA), and 3,3'-diaminodiphenyl sulfone (3,3'-DDS);
wherein the organic solvent:
  i. is a liquid capable of suspending or dissolving the polyimide,
  ii. has a Hanson polar solubility parameter between and including any two of the following numbers 2.5, 3.0, 4.0, 5.0, 6.0, 7.0, 8.0, 9.0, and 10.0; and
  iii. has a normal boiling point between and including any two of the following numbers 180, 190, 200, 210, 220, 230, 240 and 250° C.
wherein the organic solvent is a member of a group consisting of:
  a. a liquid represented by formula II:

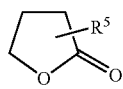

II and wherein $R^5$ is H, $CH_3$, or $CH_3CH_2$;

b. a liquid represented by formula III:

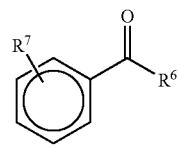

III wherein $R^6$ is H, $CH_3$, $CH_3CH_2$, or $OCH_3$ and wherein $R^7$ is H, $CH_3$, or $CH_3CH_2$;

c. a liquid represented by formula IV:

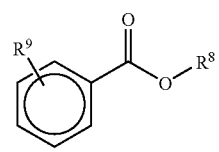

IV wherein $R^8$ is $CH_3$, or $CH_3CH_2$ and wherein $R^9$ is H, $CH_3$, or $CH_3CH_2$;

d. 2-phenoxyethanol;
e. tetrahydrofurfural acetate; and
f. combinations thereof.

2. A composition in accordance with claim 1, wherein the organic solvent comprises a liquid represented by formula II:

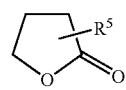

II and wherein $R^5$ is H, $CH_3$, or $CH_3CH_2$.

3. A composition in accordance with claim 1, wherein the organic solvent is a liquid represented by formula III:

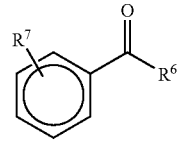

III and wherein $R^6$ is H, $CH_3$, $CH_3CH_2$, or $OCH_3$ and wherein $R^7$ is H, $CH_3$, or $CH_3CH_2$.

4. A composition in accordance with claim 1, wherein the organic solvent is a liquid represented by formula IV:

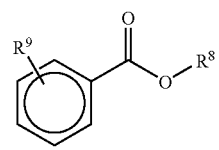

IV and wherein $R^8$ is $CH_3$, or $CH_3CH_2$ and wherein $R^9$ is H, $CH_3$, or $CH_3CH_2$.

5. A composition in accordance with claim 1, wherein the organic solvent is selected from the group consisting of 2-phenoxyethanol and tetrahydrofurfural acetate.

6. A composition according to claim 1 wherein the polyimide component is present in the composition wherein A is the polyimide component and B is the sum of the polyimide component and the organic solvent, and wherein A is between, and including, any two of the following numbers 0.05, 0.06, 0.07, 0.08, 0.09, 0.10, 0.15, 0.20, 0.40, 0.60, 1.0, 2.0, 3.0, 4.0, and 5.0 and B is 100.

7. A composition according to claim 1 wherein A is between, and including, any of the two following numbers 10, 11, 12, 13, 14, 15, 16, 17, 18, 19, 20, 21, 22, 23, 24, 25, 26, 27, 28, 29 and 30 and B is 100.

8. A composition according to claim 1 further comprising from 0 to 30 mole percent of the diamine component is selected from the group consisting of 3,3'-dihydroxy-4,4'-diaminobiphenyl (HAB), 2,4-diaminophenol, 2,3-diaminophenol, 3,3'-diamino-4,4'-dihydroxy-biphenyl, and 2,2'-bis(3-amino-4-hydroxyphenyl)hexafluoropropane.

9. A composition according to claim 1 further comprising a thermal crosslinking agent selected from the group consisting of bisphenol epoxy resin, an epoxidized copolymer of phenol and aromatic hydrocarbon, a polymer of epichlorohydrin and phenol formaldehyde, and 1,1,1-tris(p-hydroxyphenyl)ethane triglycidyl ether.

10. A composition according to claim 1 further comprising a blocked isocyanate.

11. A composition according to claim 1 further comprising a metal adhesion agent selected from group consisting of polyhydroxyphenylether (PKHH), polybenzimidazole, and polyamideimide.

12. A composition according to claim 1 further comprising a metal or metal oxide.

13. A composition according to claim 12 wherein the metal or metal oxide is pretreated with a silane or titanate agent.

* * * * *